(12) United States Patent
Sugita et al.

(10) Patent No.: US 10,435,588 B2
(45) Date of Patent: Oct. 8, 2019

(54) POLISHING COMPOSITION

(71) Applicant: NITTA HAAS INCORPORATED, Osaka-shi, Osaka (JP)

(72) Inventors: Noriaki Sugita, Kyotanabe (JP); Mika Tazuru, Kyotanabe (JP); Takayuki Matsushita, Kyotanabe (JP); Shuhei Matsuda, Kyotanabe (JP)

(73) Assignee: NITTA HAAS INCORPORATED, Osaka-Shi, Osaka ( * ) Notice: Subject to any disclaimer, the term of this patent is extended or adjusted under 35 U.S.C. 154(b) by 0 days.

(21) Appl. No.: 15/769,889

(22) PCT Filed: Oct. 20, 2016

(86) PCT No.: PCT/JP2016/081115
§ 371 (c)(1),
(2) Date: Apr. 20, 2018

(87) PCT Pub. No.: WO2017/069202
PCT Pub. Date: Apr. 27, 2017

(65) Prior Publication Data
US 2018/0305580 A1 Oct. 25, 2018

(30) Foreign Application Priority Data
Oct. 23, 2015 (JP) .................. 2015-209327

(51) Int. Cl.
C09G 1/02 (2006.01)
C09G 1/16 (2006.01)
(Continued)

(52) U.S. Cl.
CPC ............... *C09G 1/02* (2013.01); *B24B 37/00* (2013.01); *C08F 216/06* (2013.01); *C09G 1/16* (2013.01);
(Continued)

(58) Field of Classification Search
None
See application file for complete search history.

(56) References Cited

U.S. PATENT DOCUMENTS

| | | | |
|---|---|---|---|
| 2004/0148867 A1* | 8/2004 | Matsumi | C09G 1/02 51/298 |
| 2005/0176250 A1* | 8/2005 | Takahashi | B24B 37/044 438/691 |

(Continued)

FOREIGN PATENT DOCUMENTS

| | | |
|---|---|---|
| JP | 2009-62434 A | 3/2009 |
| JP | 2012-216723 A | 11/2012 |

(Continued)

OTHER PUBLICATIONS

Extended European Search Report in EP Application No. 16857515.7, dated Aug. 30, 2018, 6pp.

(Continued)

*Primary Examiner* — Allan W. Olsen
(74) *Attorney, Agent, or Firm* — Hauptman Ham, LLP

(57) ABSTRACT

A polishing composition that can suppress surface defects and reduce haze is provided. A polishing composition includes: abrasives; at least one water-soluble polymer selected from vinyl alcohol-based resins having a 1,2-diol structural unit; and an alkali compound, where an average particle size of particles in the polishing composition measured by dynamic light scattering is not more than 55 nm. Preferably, the polishing composition further includes a non-ionic surfactant. Preferably, the polishing composition further includes a polyalcohol.

3 Claims, 2 Drawing Sheets

(51) Int. Cl.
  *B24B 37/00* (2012.01)
  *C08F 216/06* (2006.01)
  *H01L 21/02* (2006.01)
  *C09K 3/14* (2006.01)
  *H01L 21/321* (2006.01)

(52) U.S. Cl.
  CPC ...... *C09K 3/1463* (2013.01); *H01L 21/02024* (2013.01); *H01L 21/3212* (2013.01)

(56) References Cited

U.S. PATENT DOCUMENTS

| | | | |
|---|---|---|---|
| 2008/0124913 A1* | 5/2008 | Choi | C09G 1/02 438/633 |
| 2009/0104778 A1* | 4/2009 | Sakanishi | C09G 1/02 438/692 |
| 2010/0029181 A1* | 2/2010 | De Rege Thesauro | B24B 37/044 451/37 |
| 2014/0213057 A1* | 7/2014 | Li | C09G 1/02 438/693 |
| 2014/0302752 A1* | 10/2014 | Tsuchiya | B24B 37/044 451/41 |
| 2015/0299517 A1 | 10/2015 | Matsushita | |
| 2016/0272846 A1* | 9/2016 | Tsuchiya | H01L 21/02024 |
| 2017/0283673 A1* | 10/2017 | Zhou | C09K 3/1436 |
| 2018/0043497 A1* | 2/2018 | Hanano | B24B 37/00 |
| 2018/0312725 A1* | 11/2018 | Sugita | B24B 37/00 |

FOREIGN PATENT DOCUMENTS

| | | |
|---|---|---|
| JP | 2014-130958 A | 7/2014 |
| WO | 2014/148399 A1 | 9/2014 |

OTHER PUBLICATIONS

International Search Report in PCT/JP2016/081115, dated Dec. 6, 2016, 4pp.

* cited by examiner

POLISHING COMPOSITION

RELATED APPLICATIONS

The present application is a National Phase of International Application Number PCT/JP2016/081115, filed Oct. 20, 2016, which claims priority to Japanese Application No. 2015-209327 filed Oct. 23, 2015.

TECHNICAL FIELD

The present invention relates to a polishing composition.

BACKGROUND ART

During polishing of a silicon wafer by chemical mechanical polishing (CMP), a polishing process with multiple steps, such as three or four steps, is performed to achieve high-precision planarization. The slurry used for the last polishing step usually contains a water-soluble polymer such as hydroxyethyl cellulose (HEC) or polyvinyl alcohol (PVA).

For example, JP 2012-216723 A discloses a polishing composition containing at least one water-soluble polymer selected from vinyl alcohol-based resins having a 1,2-diol structural unit, and alkali.

DISCLOSURE OF THE INVENTION

Recently, demands have been made for suppressing surface defects with respect to stricter standards and reducing "haze" on the surface.

The present invention was made to solve these problems. An object of the present invention is to provide a polishing composition that can reduce surface defects and haze.

According to an embodiment of the present invention, a polishing composition includes: abrasives; at least one water-soluble polymer selected from vinyl alcohol-based resins having a 1,2-diol structural unit expressed by General Formula (1) provided below; and an alkali compound, where an average particle size of particles in the polishing composition measured by dynamic light scattering is not more than 55 nm.

[Formula 1]

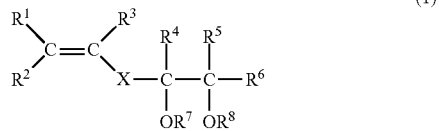

(In the formula, each of "$R^1$", "$R^2$" and "$R^3$" independently indicates a hydrogen atom or an organic group; "X" indicates a single bond or a joining chain; each of "$R^4$", "$R^5$" and "$R^6$" independently indicates a hydrogen atom or an organic group; and each of "$R^7$" and "$R^8$" independently indicates a hydrogen atom.)

According to an embodiment of the present invention, a polishing composition is such that the average particle size of particles in the polishing composition measured by dynamic light scattering is not more than 55 nm. Usually, when the average particle size of particles in the polishing composition is no more than 55 nm, the polished surface becomes hydrophobic, disadvantageously increasing the number of surface defects and/or haze. Further, if the average particle size of particles in the polishing composition is small, particles can easily adhere again to the polished wafer surface due to electric double-layer attraction/repulsion and present particle-type defects, potentially increasing the number of defects. With the above-disclosed polishing composition containing a water-soluble polymer and an alkali compound, the polished surface may be kept hydrophilic even when the size of particles in the polishing composition is reduced. Thus, according to an embodiment of the present invention, the average particle size of particles in the polishing composition is not more than 55 nm to suppress surface defects and reduce haze on the polished silicon wafer.

EMBODIMENTS FOR CARRYING OUT THE INVENTION

Figure 1:
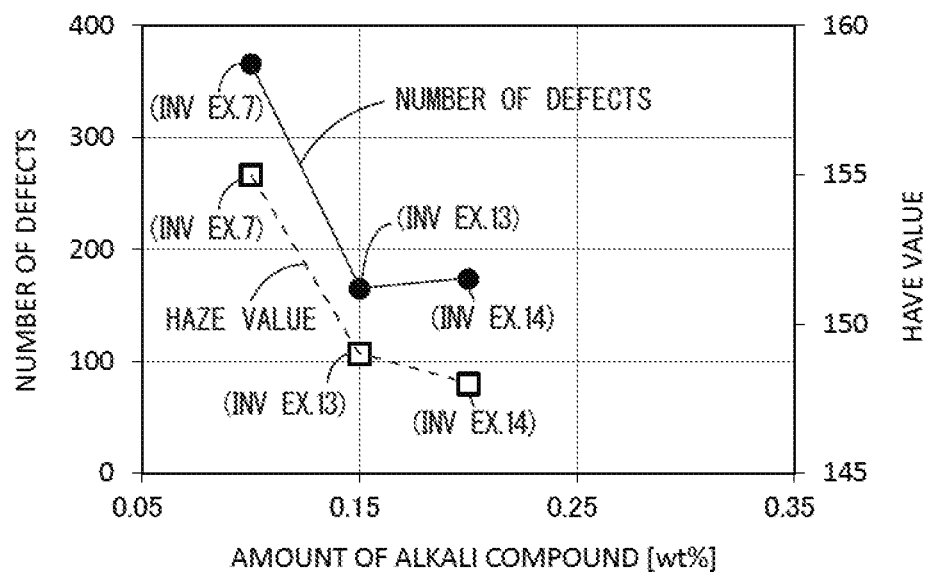
FIG. 1 is a graph showing the relationship between the amount of the alkali compound and the number of defects and haze value for Inventive Examples 7, 13 and 14.

Embodiments of the present invention will be described in detail.

A polishing composition according to an embodiment of the present invention, COMP1, includes: abrasives; at least one water-soluble polymer selected from vinyl alcohol-based resins having a 1,2-diol structural unit expressed by General Formula (1) provided below; and an alkali compound, where an average particle size of particles in the polishing composition measured by dynamic light scattering is not more than 55 nm.

[Formula 1]

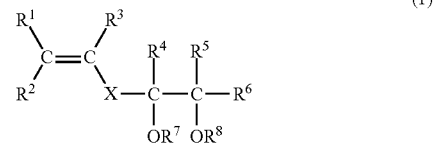

(In the formula, each of "$R^1$", "$R^2$" and "$R^3$" independently indicates a hydrogen atom or an organic group; "X" indicates a single bond or a joining chain; each of "$R^4$", "$R^5$" and "$R^6$" independently indicates a hydrogen atom or an organic group; and each of "$R^7$" and "$R^8$" independently indicates a hydrogen atom.)

The polishing composition COMP1 is used for polishing silicon.

"Particles in the polishing composition" as used herein means the dispersed particles of abrasives to which water-soluble polymer etc. adheres.

The average particle size of particles contained in the polishing composition COMP1 is not more than 55 nm. "Average particle size" as used herein is a value indicated when the polishing composition COMP1 is measured by dynamic light scattering. The average particle size obtained by measuring particles in the polishing composition by dynamic light scattering may be hereinafter referred to simply as "average particle size of particles in the polishing composition".

As discussed above, the average particle size of particles in the polishing composition COMP1 is not more than 55 nm. Since the average particle size of particles in the polishing composition COMP1 is not more than 55 nm, this reduces the mechanical polishing effect of particles, which reduces damage to the wafer, thereby improving the surface characteristics of the wafer. The average particle size of particles in the polishing composition COMP1 is preferably not more than 33 nm, and more preferably not more than 14 nm.

Usually, when the average particle size of particles in the polishing composition is no more than 55 nm, the polished surface becomes hydrophobic, disadvantageously increasing the number of surface defects and/or haze. Further, if the average particle size of particles in the polishing composition is small, particles can easily adhere again to the polished wafer surface due to electric double-layer attraction/repulsion and present particle-type defects, potentially increasing the number of defects. By using the water-soluble polymer and alkali compound expressed by Formula (1), the polished surface may be kept hydrophilic even when the size of particles in the polishing composition is reduced. Thus, in the polishing composition COMP1, the average particle size of particles in the polishing composition is reduced to reduce surface defects and haze.

Abrasives used may be include, for example, colloidal silica, fumed silica, colloidal alumina, fumed alumina and ceria. To improve the surface smoothness of the silicon wafer, it is preferable to use colloidal silica as abrasives.

If the abrasives included are abrasives with an average particle size measured by dynamic light scattering of not more than 50 nm and the water-soluble polymer included is at least one water-soluble polymer selected from vinyl alcohol-based resins having a 1,2-diol structural unit expressed by General Formula (1), the average particle size of particles in the polishing composition will be no more than 55 nm. When simply "average particle size" is mentioned hereinafter, this means the average particle size measured by dynamic light scattering. The average particle size of abrasives is preferably not more than 31 nm, and more preferably not more than 12 nm.

The amount of abrasives in the undiluted solution of the polishing composition COMP1 may be, for example, 1.5 to 9.5 wt %.

The water-soluble polymer expressed by Formula (1) is a modified polyvinyl alcohol (PVA). The modified PVA used may have any degree of polymerization. The modified PVA used may have any degree of saponification. A single type of the modified PVA may be used, or two or more types of the modified PVA may be used.

The modified PVA has a carbon double bond in its molecular structure. That is, the molecules of the modified PVA have a generally straight structure, which cannot easily be deformed. Accordingly, when the modified PVA forms a protective film on the surface of the wafer, the protective film has little gaps and thus high density, where generally straight structures are arranged or laid over each other.

The alkali compound may be, for example, ammonia, an aliphatic amine, a heterocyclic amine, a carbonate, a hydroxide, or a quaternary ammonium salt.

The aliphatic amine may be, for example, methylamine, dimethylamine, trimethylamine, ethylamine, diethylamine, propylamine, diethylenetriamine, triethylenetetramine, triethylamine, ethylenediamine, ethanolamine, triethanolamine, or hexamethylenediamine.

The heterocyclic amine may be, for example, anhydrous piperazine, piperazine hexahydrate, 1-(2-aminoethyl)piperazine and N-methylpiperazine.

The carbonate may be, for example, potassium hydrogencarbonate, ammonium carbonate, potassium carbonate, sodium hydrogencarbonate, sodium carbonate, or ammonium hydrogencarbonate.

The hydroxide may be, for example, potassium hydroxide or sodium hydroxide.

The quaternary ammonium salt may be, for example, tetramethylammonium hydroxide, or tetraethylammonium hydroxide.

The alkali compound may be made of one of these listed compounds, or may be made of two or more of them mixed together.

Taking account of polishing speed and to balance the alkali compound and other components of the polishing composition, the amount of the alkali compound in the undiluted solution of the polishing composition COMP1 is preferably not less than 0.005 wt %, more preferably not less than 0.1 wt %, and still more preferably not less than 0.15 wt %. The amount of the alkali compound is preferably not more than 1.0 wt %, and more preferably not more than 0.3 wt %. If the amount of the alkali compound is less than 0.005 wt %, the etching power on the wafer surface decreases, which decreases the polishing speed, which may result in not all the polishing scratches produced during the primary and secondary polishing being removed. Further, if the amount of the alkali compound exceeds 1.0 wt %, abrasives can easily aggregate, which may lead to deterioration in terms of the number of defects and haze value. Further, if the amount of the alkali compound exceeds 1.0 wt %, the surface of the wafer is etched excessively, increasing the roughness of the surface of the wafer, which may increase the number of defects on the surface of the polished wafer or lead to deterioration in haze value.

Since the polishing composition COMP1 contains an alkali compound, the pH is adjusted to a range of 8 to 12, for example.

Preferably, the polishing composition COMP1 further includes a non-ionic surfactant. The non-ionic surfactant may be, for example, N, N, N',N'-tetrakis(polyoxyethylene) (polyoxypropylene)ethylenediamine (i.e., poloxamine) expressed by Formula (2) or (3) provided below. Other non-ionic surfactants may include, for example, poloxamer, a polyoxyalkylene alkyl ether, a polyoxyalkylene fatty acid ester, and polyoxyalkylenealkylamine.

The polyoxyalkylene alkyl ether may be, for example, polyoxyethylene lauryl ether, polyoxyethylene cetyl ether, or polyoxyethylene stearyl ether. The polyoxyalkylene fatty acid ester may be, for example, polyoxyethylene monolaurate, or polyoxyethylene monostearate. The polyoxyalkylenealkylamine may be, for example, polyoxyethylene lauryl amine, or polyoxyethylene oleylamine.

[Formula 2]

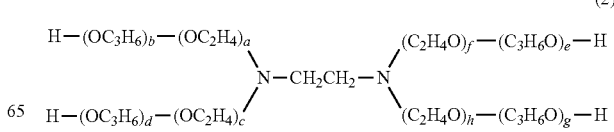

(2)

(In the formula, "a" to "g" each indicate an integer.)

[Formula 3]

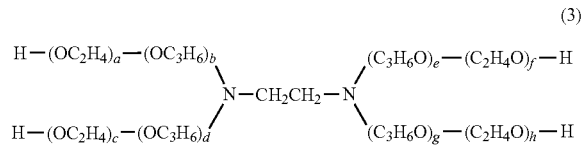

(3)

(In the formula, "a" to "g" each indicate an integer.)

The water-soluble polymer (PVA resin) is adsorbed on the wafer surface to protect the wafer surface. If the polishing composition COMP1 further includes a non-ionic surfactant, it is thought that the non-ionic surfactant enters gaps between molecules of the water-soluble polymer and is adsorbed on the surface of the wafer with high density. As the non-ionic surfactant fills gaps in the protective film, the density and strength of the protective film improve, thereby improving its ability to protect the surface of the wafer. Thus, if the polishing composition COMP1 further includes a non-ionic surfactant, it is thought that the ability to protect the surface of the wafer increases and thus the number of defects and haze value on the wafer after polishing decrease.

The amount of the non-ionic surfactant relative to the weight of the undiluted solution of the polishing composition may be, for example, 0.001 to 0.05 wt %, and more preferably 0.01 to 0.03 wt %. If the amount of the non-ionic surfactant is less than 0.001 wt %, the coating power on the surface of the wafer decreases and thus cannot protect the wafer from damage from alkali etching and abrasives, potentially leading to deterioration in terms of the number of defects and haze value. If the amount of the non-ionic surfactant is more than 0.02 wt %, the number of defects may increase. A single type of the non-ionic surfactant may be used, or two or more types of the non-ionic surfactant may be used.

Preferably, in addition to the non-ionic surfactant, the polishing composition COMP1 further includes a polyalcohol. A polyalcohol is an alcohol including two or more hydroxy groups in one molecule. The polyalcohol may be, for example: a glycoside, having sugar and an organic compound other than sugar in glycosidic linkage; glycerine; propylene glycol; or polyethylene glycol. The polyalcohol may also be, for example, a polyalcohol fatty acid ester, having a polyalcohol such as glycoside, glycerine, propylene glycol or polyethylene glycol and fatty acid in ester linkage, or a polyalcohol alkylene oxide adduct, having a polyalcohol combined with alkylene oxide. The glycoside may be an alkylene oxide derivative of methylglucoside, expressed by Formula (4) provided below, for example.

[Formula 4]

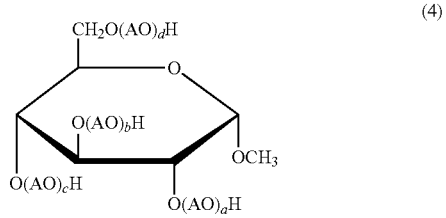

(4)

(In the formula, "AO" indicates alkylene oxide; "a" to "d" each indicate an integer.)

The alkylene oxide derivative of methylglucoside may be, for example, polyoxyethylene methyl glucoside or polyoxypropylene methyl glucoside.

A polyalcohol has a smaller molecular weight than a water-soluble polymer. This means a short time between the time point at which polishing creates a new polished surface on the wafer and the time point at which the polyalcohol is adsorbed on this new polished surface. Immediately after a new polished surface appears, the polyalcohol forms thin film, preventing organic matter, foreign matter and abrasives from adhering to the wafer surface. That is, if the polishing composition COMP1 includes a polyalcohol, it is thought that thin film of polyalcohol is formed at a step preceding the formation of a protective film of the modified PVA on the wafer surface, increasing the ability to protect the wafer surface.

A single type of the polyalcohol may be used, or two or more types of the polyalcohol may be used. To suppress surface defects and reduce haze, it is preferable to use two or more types of polyalcohol combined.

In the polishing composition COMP1, the amount of the polyalcohol is preferably smaller than the amount of the modified PVA. Further, if the polishing composition COMP1 includes a non-ionic surfactant, the amount of the polyalcohol is preferably smaller than the amount of the non-ionic surfactant. Since film of polyalcohol is water-repellent, the wafer surface may be water-repellent if the amount of polyalcohol is large.

If the polishing composition COMP1 includes a non-ionic surfactant and further a polyalcohol, it is thought that the polishing composition acts in the following manner during wafer polishing: First, when polishing creates a new polished surface on the wafer, the polyalcohol, which has a low molecular weight, immediately forms thin film of polyalcohol on the wafer surface. Thereafter, a high-density film made from the modified PVA and non-ionic surfactant is formed on the wafer surface such that the wafer surface is effectively protected.

According to an embodiment of the present invention, the polishing composition COMP1 may further include, for example, a chelating agent and/or an acid substance, as required by the desired characteristics.

The chelating agent may be, for example, an aminocarboxylic acid-based chelating agent or an organosulphonic acid-based chelating agent.

The aminocarboxylic acid-based chelating agent may be, for example, ethylenediamine tetraacetic acid, sodium ethylenediaminetetraacetate, nitrilotriacetic acid, sodium nitrilotriacetate, ammonium nitrilotriacetate, hydroxyethyl ethylenediamine triacetic acid, hydroxyethyl ethylenediamine sodium triacetate, diethylenetriamine pentaacetic acid, diethylenetriamine sodium pentaacetate, triethylenetetramine hexaacetic acid, or triethylenetetramine sodium hexaacetate.

The organophosphonate-based chelating agent may be, for example, 2-aminoethylphophonic acid, 1-hydroxyethylidene-1,1-diphosphonate, aminotri(methylenephosphonic acid), ethylenediaminetetrakis(methylenephosphonic acid), diethylene triaminepenta(methylenephosphonic acid), ethane-1,1,-diphosphonate, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, or α-methylphosphono succinic acid.

The acid substance may be, for example, a carboxylate, sulfonate, acidic phosphate ester salt, phosphonate, inorganic acid salt, ethylene oxide adduct of alkylamine, polyalcohol partial ester, or carboxylic acid amid.

The polishing composition COMP1 may be prepared by mixing at least one water-soluble polymer selected from vinyl alcohol-based resins having a 1,2-diol structural unit expressed by Formula (1), abrasives, an alkali compound and other ingredients in appropriate amounts and adding water. Alternatively, the polishing composition COMP1 may be prepared by successively mixing abrasives, at least one water-soluble polymer selected from vinyl alcohol-based resins having a 1,2-diol structural unit expressed by Formula (1), an alkali compound and other ingredients into water. These components may be mixed by a means commonly used in the technical field of polishing composition, such as a monogenizer and ultrasonic waves.

The polishing composition COMP1 described above includes abrasives, at least one water-soluble polymer selected from vinyl alcohol-based resins having a 1,2-diol structural unit; and an alkali compound, and may further include a non-ionic surfactant, and, in addition to the non-ionic surfactant, may further include a polyalcohol. On the other hand, an embodiment of the present invention also involves a polishing composition COMP2 including abrasives, at least one water-soluble polymer selected from vinyl alcohol-based resins having a 1,2-diol structural unit, an alkali compound and a polyalcohol and containing no non-ionic surfactant.

In connection with each of the above-described polishing compositions COMP1 and COMP2, the average particle size of particles in the polishing composition is not more than 55 nm and the mechanical polishing effect of particles is reduced, which reduces damage to the wafer, thereby reducing the number of defects and haze value on the polished wafer. As such, using the polishing composition COMP1 to polish a wafer makes it possible to satisfy the high-level surface characteristics required of the wafer after the last polishing step.

The above-illustrated embodiments are merely examples for carrying out the present invention. As such, the present invention is not limited to the above-illustrated embodiments and may be modified as appropriate without departing from the spirit of the invention.

EXAMPLES

The present invention will now be described in detail referring to examples. Specifically, polishing compositions according to the following Inventive Examples 1 to 27 and Comparative Examples 1 to 8 were prepared and each polishing composition was used to polish a silicon wafer. Then, the number of defects and haze value after polishing were measured.

(Polishing Composition)

The make-up of the polishing compositions of Inventive Examples 1 to 27 and Comparative Examples 1 to 8 will be described. The make-up of the polishing compositions are also shown in Tables 1 to 6. In Tables 1 to 6, the weight percentage for each component indicates the weight percentage relative to the total polishing composition (undiluted solution).

The polishing composition of Inventive Example 1 was made by mixing 3.5 wt % abrasives (1), 0.10 wt % ammonium hydroxide (NH$_4$OH), and 0.1 wt % water-soluble polymer (modified PVA) into water, and providing a total of 100 wt %.

Abrasives (1) used here are colloidal silica, and the average particle size measured by dynamic light scattering was 50 nm. A modified PVA with a degree of polymerization of 450 and a molecular weight of 20,000 was used. The measurement of average particle size by dynamic scattering was performed using an "ELS-Z2" particle-size measurement system from Otsuka Electronics Co., Ltd.

The polishing composition of Inventive Example 2 had the same make-up as Inventive Example 1 except that 0.015 wt % poloxamine (1) was added to the polishing composition of Inventive Example 1.

Poloxamine (1) used here was one expressed by Formula (2). The mass proportion of ethyleneoxide to propyleneoxide in poloxamine (1), EO/PO, was EO/PO=40/60 and the molecular weight was 6,900.

The polishing compositions of Inventive Examples 3 and 4 had the same make-up as Inventive Example 2 except that the amount of poloxamine (1) in the polishing composition of Inventive Example 2 was changed to 0.020 wt % and 0.025 wt %, respectively.

The polishing composition of Inventive Example 5 had the same make-up as Inventive Example 3 except that 0.0050 wt % polyalcohol (1) was added to the polishing composition of Inventive Example 3.

Polyalcohol (1) used here was polyoxypropylene methyl glucoside expressed by Formula (5) and had a molecular weight of 774.

[Formula 5]

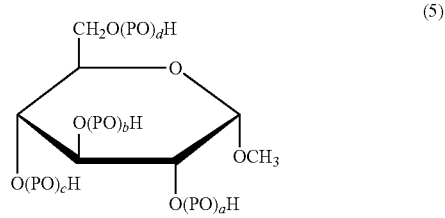

(5)

(In the formula, "PO" indicates propylene oxide)

The polishing composition of Inventive Example 6 had the same make-up as Inventive Example 5 except that the amount of polyalcohol (1) of the polishing composition of Inventive Example 5 was changed to 0.0100 wt %.

The polishing composition of Inventive Example 7 had the same make-up as Inventive Example 5 except that the amount of poloxamine (1) of the polishing composition of Inventive Example 5 was changed to 0.015 wt %.

The polishing composition of Inventive Example 8 had the same make-up as Inventive Example 7 except that polyalcohol (1) of the polishing make-up of Inventive Example 7 was replaced by 0.0050 wt % polyalcohol (2).

Polyalcohol (2) used here was polyoxyethylene methyl glucoside expressed by Formula (6) and had a molecular weight of 634.

[Formula 6]

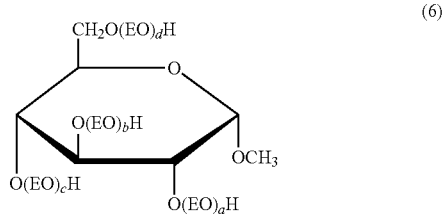

(6)

(In the formula, "EO" indicates ethylene oxide)

The polishing composition of Inventive Example 9 had the same make-up as Inventive Example 7 except that the amount of polyalcohol (1) of the polishing composition of Inventive Example 7 was changed to 0.0025 wt % and 0.0025 wt % polyalcohol (2) was further added.

The polishing composition of Inventive Example 10 had the same make-up as Inventive Example 7 except that poloxamine (1) of the polishing composition of Inventive Example 7 was replaced by 0.015 wt % poloxamine (2).

Poloxamine (2) used here was one expressed by Formula (3). The mass proportion of ethyleneoxide to propyleneoxide in poloxamine (2), EO/PO, was EO/PO=80/20 and the molecular weight was 25,000.

The polishing compositions of Inventive Examples 11 and 12 had the same make-up as Inventive Examples 2 and 7 except that abrasives (1) of the polishing compositions of Inventive Examples 2 and 7 were replaced by 3.5 wt % abrasives (2).

Abrasives (2) used here were colloidal silica and the average particle size measured by dynamic light scattering was 30 nm.

The polishing compositions of Inventive Examples 13 and 14 had the same make-up as Inventive Example 7 except that the amount of the alkali compound of the polishing composition of Inventive Example 7 was changed to the 0.15 wt % and 0.20 wt %, respectively.

The polishing compositions of Inventive Examples 15 and 16 had the same make-up as Inventive Example 2 except that the amount of abrasives (1) of the polishing composition of Inventive Example 2 was changed to 5.5 wt % and 7.5 wt %, respectively.

The polishing composition of Inventive Example 17 had the same make-up as Inventive Example 6 except for the absence of poloxamine (1).

The polishing compositions of Inventive Examples 18 and 19 had the same make-up as Inventive Example 17 except that the amount of polyalcohol (1) of the polishing composition of Inventive Example 17 was changed to 0.0200 wt % and 0.0300 wt %, respectively.

The polishing composition of Inventive Example 20 had the same make-up as Inventive Example 17 except that 0.0100 wt % polyalcohol (2) was added to the polishing composition of Inventive Example 17.

The polishing compositions of Inventive Examples 21 to 26 had the same make-up as Inventive Example 7 except that abrasives (1) of the polishing composition of Inventive Example 7 were replaced by abrasives with average particle sizes measured by dynamic light scattering of 31 nm, 25 nm, 19 nm, 16 nm, 12 nm, and 5 nm, respectively. All these abrasives were colloidal silica and were present in an amount of 3.5 wt %.

The polishing composition of Inventive Example 27 had the same make-up as Inventive Example 1 except that the amount of the alkali compound of the polishing composition of Inventive Example 1 was changed to 0.019 wt %.

The polishing composition of Comparative Example 1 had the same make-up as Inventive Example 1 except that abrasives (1) of the polishing composition of Inventive Example 1 was replaced by 3.5 wt % abrasives (3).

Abrasives (3) used here were colloidal silica, and had an average particle size measured by dynamic light scattering of 70 nm.

The polishing composition of Comparative Example 2 had the same make-up as Comparative Example 1 except that 0.015 wt % poloxamine (1) was added to the polishing composition of Comparative Example 1.

The polishing composition of Comparative Example 3 had the same make-up as Comparative Example 2 except that the amount of poloxamine (1) of the polishing composition of Comparative Example 2 was changed to 0.020 wt %.

The polishing composition of Comparative Example 4 had the same make-up as Comparative Example 2 except that the amount of the alkali compound of the polishing composition of Comparative Example 2 was changed to 0.20 wt %.

The polishing composition of Comparative Example 5 had the same make-up as Comparative Example 2 except that 0.0050 wt % polyalcohol (1) was added to the polishing composition of Comparative Example 2.

The polishing composition of Comparative Example 6 had the same make-up as Inventive Example 1 except that abrasives (1) of the polishing composition of Inventive Example 1 were replaced by 3.5 wt % abrasives (4).

Abrasives (4) used here were colloidal silica and had an average particle size measured by dynamic light scattering of 99 nm.

The polishing compositions of Comparative Examples 7 and 8 had the same make-up as Inventive Example 27 except that the abrasives of the polishing composition of Inventive Example 27 were replaced by abrasives with average particle sizes measured by dynamic light scattering of 70 nm and 62 nm, respectively. All of these abrasives were colloidal silica and were present in an amount of 3.5 wt %.

The polishing compositions of the above-described inventive and comparative examples were used to perform polishing under the polishing conditions provided below. Then, for each composition, the number of defects, haze value and the average particle size of particles in the polishing composition were measured. The polishing conditions and the measurement methods will be discussed below.

(Polishing Conditions)

A polishing device (SPP800S from Okamoto Machine Tool Works Ltd.) was used to polish silicon wafers for four minutes, where the polishing compositions of Inventive Examples 1 to 27 and Comparative Examples 1 to 8 diluted 31 times were supplied at a rate of 1000 mL/min onto a polishing pad (SUPREME (registered trademark) RN-H from Nitta Haas Incorporated). Each of the silicon wafers used had a diameter of 300 mm and was of a p-type semiconductor, and had the crystal orientation (100). The polishing was performed under the following conditions: the pressure applied to the silicon wafer was 0.012 MPa, the rotation speed of the polishing surface plate 40 rpm, and the rotation speed of the carrier 39 rpm.

(Method of Measuring Number of Defects)

For each of Inventive Examples 1 to 27 and Comparative Examples 1 to 8, the number of defects was measured using a wafer defect inspection/review device ("MAGICS M5640" from Lasertec Corporation). The maximum sensitivity of the wafer defect inspection/review device during measurement was D37 mV.

(Method of Measuring Haze Value)

For each of Inventive Examples 1 to 27 and Comparative Examples 1 to 8, the haze value was measured using a wafer surface inspection device ("LS6600" from Hitachi Engineering Co., Ltd.).

(Measurement of Average Particle Size of Particles in Polishing Composition)

For each of Inventive Examples 1 to 27 and Comparative Examples 1 to 8, the polishing composition was measured by dynamic light scattering to measure the average particle size of particles in the polishing composition. The measurement was performed using an "ELS-Z2" particle-size measurement system from Otsuka Electronics Co., Ltd.

The results of the measurements of the number of defects, haze value and average particle size of particles in the polishing composition are shown in Tables 1 to 6.

TABLE 1

| | | Inv. Ex. 1 | Inv. Ex. 2 | Inv. Ex. 3 | Inv. Ex. 4 | Inv. Ex. 5 | Inv. Ex. 6 | Inv. Ex. 7 |
|---|---|---|---|---|---|---|---|---|
| Composition of undiluted solution of polishing composition [wt %] | abrasives (1) with particle size of 50 nm | 3.5 | 3.5 | 3.5 | 3.5 | 3.5 | 3.5 | 3.5 |
| | abrasives (2) with particle size of 30 nm | — | — | — | — | — | — | — |
| | abrasives (3) with particle size of 70 nm | — | — | — | — | — | — | — |
| | abrasives (4) with particle size of 99 nm | — | — | — | — | — | — | — |
| | alkali compound (NH$_4$OH) | 0.1 | 0.1 | 0.1 | 0.1 | 0.1 | 0.1 | 0.1 |
| | water-soluble polymer (modified PVA) | 0.1 | 0.1 | 0.1 | 0.1 | 0.1 | 0.1 | 0.1 |
| | non-ionic surfactant (poloxamine (1)) | — | 0.015 | 0.02 | 0.025 | 0.02 | 0.02 | 0.015 |
| | non-ionic surfactant (poloxamine (2)) | — | — | — | — | — | — | — |
| | polyalcohol (1) | — | — | — | — | 0.005 | 0.01 | 0.005 |
| | polyalcohol (2) | — | — | — | — | — | — | — |
| | Number of defects | 951 | 855 | 742 | 590 | 416 | 337 | 368 |
| | Haze value | 170 | 159 | 152 | 145 | 146 | 140 | 155 |
| | Average particle size of particles in polishing composition [nm] | 55 | 55 | 54 | 55 | 54 | 54 | 54 |

TABLE 2

| | | Inv. Ex. 8 | Inv. Ex. 9 | Inv. Ex. 10 | Inv. Ex. 11 | Inv. Ex. 12 | Inv. Ex. 13 | Inv. Ex. 14 |
|---|---|---|---|---|---|---|---|---|
| Composition of undiluted solution of polishing composition [wt %] | abrasives (1) with particle size of 50 nm | 3.5 | 3.5 | 3.5 | — | — | 3.5 | 3.5 |
| | abrasives (2) with particle size of 30 nm | — | — | — | 3.5 | 3.5 | — | — |
| | abrasives (3) with particle size of 70 nm | — | — | — | — | — | — | — |
| | abrasives (4) with particle size of 99 nm | — | — | — | — | — | — | — |
| | alkali compound (NH$_4$OH) | 0.1 | 0.1 | 0.1 | 0.1 | 0.1 | 0.15 | 0.2 |
| | water-soluble polymer (modified PVA) | 0.1 | 0.1 | 0.1 | 0.1 | 0.1 | 0.1 | 0.1 |
| | non-ionic surfactant (poloxamine (1)) | 0.015 | 0.015 | — | 0.015 | 0.015 | 0.015 | 0.015 |
| | non-ionic surfactant (poloxamine (2)) | — | — | 0.015 | — | — | — | — |
| | polyalcohol (1) | — | 0.0025 | 0.005 | — | 0.005 | 0.005 | 0.005 |
| | polyalcohol (2) | 0.005 | 0.0025 | — | — | — | — | — |
| | Number of defects | 512 | 386 | 230 | 445 | 330 | 165 | 174 |
| | Haze value | 156 | 155 | 146 | 170 | 168 | 149 | 148 |
| | Average particle size of particles in polishing composition [nm] | 55 | 54 | 54 | 34 | 35 | 55 | 54 |

TABLE 3

| | | Inv. Ex. 15 | Inv. Ex. 16 | Inv. Ex. 17 | Inv. Ex. 18 | Inv. Ex. 19 | Inv. Ex. 20 |
|---|---|---|---|---|---|---|---|
| Composition of undiluted solution of polishing composition [wt %] | abrasives (1) with particle size of 50 nm | 5.5 | 7.5 | 3.5 | 3.5 | 3.5 | 3.5 |
| | abrasives (2) with particle size of 30 nm | — | — | — | — | — | — |
| | abrasives (3) with particle size of 70 nm | — | — | — | — | — | — |
| | abrasives (4) with particle size of 99 nm | — | — | — | — | — | — |
| | alkali compound (NH$_4$OH) | 0.1 | 0.1 | 0.1 | 0.1 | 0.1 | 0.1 |
| | water-soluble polymer (modified PVA) | 0.1 | 0.1 | 0.1 | 0.1 | 0.1 | 0.1 |
| | non-ionic surfactant (poloxamine (1)) | 0.015 | 0.015 | — | — | — | — |
| | non-ionic surfactant (poloxamine (2)) | — | — | — | — | — | — |
| | polyalcohol (1) | — | — | 0.01 | 0.02 | 0.03 | 0.01 |
| | polyalcohol (2) | — | — | — | — | — | 0.01 |
| | Number of defects | 915 | 948 | 78 | 73 | 129 | 87 |
| | Haze value | 158 | 159 | 155 | 154 | 151 | 151 |
| | Average particle size of particles in polishing composition [nm] | 54 | 55 | 54 | 55 | 55 | 55 |

TABLE 4

|  |  | Inv. Ex. 21 | Inv. Ex. 22 | Inv. Ex. 23 | Inv. Ex. 24 | Inv. Ex. 25 | Inv. Ex. 26 | Inv. Ex. 27 |
|---|---|---|---|---|---|---|---|---|
|  | Average particle size of abrasives [nm] | 31 | 25 | 19 | 16 | 12 | 5 | 50 |
| Composition of undiluted solution [wt %] | abrasives | 3.5 | 3.5 | 3.5 | 3.5 | 3.5 | 3.5 | 3.5 |
|  | alkali compound (NH$_4$OH) | 0.1 | 0.1 | 0.1 | 0.1 | 0.1 | 0.1 | 0.019 |
|  | water-soluble polymer (modified PVA) | 0.1 | 0.1 | 0.1 | 0.1 | 0.1 | 0.1 | 0.1 |
|  | non-ionic surfactant (poloxamine (1)) | 0.015 | 0.015 | 0.015 | 0.015 | 0.015 | 0.015 | — |
|  | non-ionic surfactant (poloxamine (2)) | — | — | — | — | — | — | — |
|  | polyalcohol (1) | 0.005 | 0.005 | 0.005 | 0.005 | 0.005 | 0.005 | — |
|  | polyalcohol (2) | — | — | — | — | — | — | — |
|  | Number of defects | 218 | 214 | 252 | 187 | 236 | 168 | 837 |
|  | Haze value | 155 | 149 | 147 | 150 | 142 | 142 | 178 |
|  | Average particle size of particles in polishing composition [nm] | 33 | 28 | 22 | 18 | 14 | 7 | 55 |

TABLE 5

|  |  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|
| Composition of undiluted solution of polishing composition [wt %] | abrasives (1) with particle size of 50 nm | — | — | — | — | — | — |
|  | abrasives (2) with particle size of 30 nm | — | — | — | — | — | — |
|  | abrasives (3) with particle size of 70 nm | 3.5 | 3.5 | 3.5 | 3.5 | 3.5 | — |
|  | abrasives (4) with particle size of 99 nm | — | — | — | — | — | 3.5 |
|  | alkali compound (NH$_4$OH) | 0.1 | 0.1 | 0.1 | 0.2 | 0.1 | 0.1 |
|  | water-soluble polymer (modified PVA) | 0.1 | 0.1 | 0.1 | 0.1 | 0.1 | 0.1 |
|  | non-ionic surfactant (poloxamine (1)) | — | 0.015 | 0.02 | 0.015 | 0.015 | 0.015 |
|  | non-ionic surfactant (poloxamine (2)) | — | — | — | — | — | — |
|  | polyalcohol (1) | — | — | — | — | 0.005 | 0.005 |
|  | polyalcohol (2) | — | — | — | — | — | — |
|  | Number of defects | 2212 | 1906 | 1299 | 1026 | 434 | 1264 |
|  | Haze value | 193 | 172 | 168 | 162 | 156 | 166 |
|  | Average particle size of particles in polishing composition [nm] | 72 | 72 | 73 | 73 | 72 | 100 |

TABLE 6

|  |  | Comp. Ex. 7 | Comp. Ex. 8 |
|---|---|---|---|
|  | Average particle size of abrasives [nm] | 70 | 62 |
| Composition of undiluted solution [wt %] | abrasives | 3.5 | 3.5 |
|  | alkali compound (NH$_4$OH) | 0.019 | 0.019 |
|  | water-soluble polymer (modified PVA) | 0.1 | 0.1 |
|  | non-ionic surfactant (poloxamine (1)) | — | — |
|  | non-ionic surfactant (poloxamine (2)) | — | — |
|  | polyalcohol (1) | — | — |
|  | polyalcohol (2) | — | — |
|  | Number of defects | 1918 | 1859 |
|  | Haze value | 192 | 190 |
|  | Average particle size of particles in polishing composition [nm] | 72 | 67 |

Evaluation of Inventive Examples

A comparison between Inventive Example 1 and Comparative Example 1 in which the polishing composition included abrasives, alkali compound and modified PVA demonstrates that Inventive Example 1 including abrasives of a small size (average particle size: 50 nm) was significantly better in terms of the number of defects and haze value on the silicon wafer than Comparative Example 1 with a larger abrasive size (average particle size: 70 nm).

The fact that changing the abrasives of the polishing composition from abrasives (3) to abrasives (1), having a smaller size, led to improvements in the number of defects and haze value on the silicon wafer can also be verified by a comparison between Inventive Example 2 and Comparative Example 2 and a comparison between Inventive Example 3 and Comparative Example 3, in which the polishing composition included abrasives, an alkali compound, a modified PVA and a poloxamine.

Further, the fact that changing the abrasives of the polishing composition from abrasives (3) to abrasives (1), having a smaller size, led to improvements in the number of defects and haze value of the silicon wafer can also be verified by a comparison between Inventive Example 7 and Comparative Example 5, in which the polishing composition included abrasives, an alkali compound, a modified PVA, a poloxamine and a polyalcohol.

Cases where the abrasives of the polishing composition were changed from abrasives (1) (average particle size: 50 nm) to abrasives (2) with a still smaller size (average particle size: 30 nm) will be discussed. A comparison between Inventive Examples 2 and 11 in which the polishing composition included abrasives, an alkali compound, a modified PVA, and a poloxamine, reveals that the change from abrasives (1) to abrasives (2) reduced the number of defects and increased the haze value. Further, a comparison between Inventive Examples 7 and 12, in which the polishing composition included abrasives, an alkali compound, a modified PVA, poloxamine, and a polyalcohol reveals that the change from abrasives (1) to abrasives (2) left the number of defects substantially unchanged, and increased the haze value. The haze value increased presumably because small-size abrasives (2) had a smaller ability to remove surface roughness caused by polishing scratches produced during the primary or secondary polishing than abrasives (1).

A comparison between Inventive Example 1, in which the polishing composition included no poloxamine, and Inventive Example 2 in which the poloxamine was added to the polishing composition of Inventive Example 1, reveals that both the number of defects and haze value decreased.

Modified PVA is adsorbed on the wafer surface and protects the wafer surface. If the polishing composition further includes poloxamine, it is thought that poloxamine enters gaps between molecules of the modified PVA and is adsorbed on the surface of the wafer. This is presumably why, in Inventive Example 2, the ability to protect the wafer surface increased and the number of defects and haze value of the polished wafer decreased.

Further, a comparison between Inventive Examples 2 to 4, in which the polishing composition included abrasives, an alkali compound, modified PVA, and poloxamine (1) where the amount of poloxamine (1) was varied, reveals that both the number of defects and the haze value decreased as the amount of poloxamine (1) increased.

Inventive Examples 7 and 10 show that changing the type of poloxamine mixed in the polishing composition from poloxamine (1) to poloxamine (2) produced improvements in the number of defects and haze value. This is presumably because of influences of the difference in the EO/PO ratio in the poloxamine and the difference in the molecular weight of poloxamine.

The difference in the EO/PO ratio in poloxamine will be discussed. The EO/PO ratio of poloxamine (1) is 40/60, while the EO/PO of poloxamine (2) is 80/20. The polishing composition containing poloxamine (2) having higher EO proportion is more hydrophilic and thus can easily be wet-extended over the wafer surface, which is thought to be the reason why the ability to protect the wafer surface increased.

The difference in the molecular weight of poloxamine will be discussed. The molecular weight of poloxamine (1) is 6,900, while the molecular weight of poloxamine (2) is 25,000. Since the poloxamine (2) has a higher molecular weight than poloxamine (1), it is thought that, when poloxamine (2) is adsorbed on the wafer surface, the layer covering the wafer is thicker, increasing the ability to protect the wafer surface.

A comparison between Inventive Examples 2 and 3, in which the polishing composition including abrasives, an alkali compound, a modified PVA and poloxamine (1) contained no polyalcohol, and Inventive Examples 7 and 5, where each of the polishing compositions of Inventive Examples 2 and 3 further included polyalcohol (1), shows that a polishing composition further containing polyalcohol (1) reduced both the number of defects and haze value.

When a polishing composition further contains polyalcohol (1), which has a smaller molecular weight than poloxamine and modified PVA, it is immediately adsorbed on the polished wafer surface, forming thin film. This is presumably why the ability of the polishing composition to protect the wafer surface increased.

Further, a comparison between Inventive Examples 5 and 6, in which the polishing composition included abrasives, an alkali compound, modified PVA, poloxamine, and polyalcohol and the amount of polyalcohol was changed, shows that, as the amount of polyalcohol increased, both the number of defects and haze value decreased.

Inventive Examples 7 and 9, in which the type of polyalcohol contained in the polishing composition was varied, reveal that, regardless of whether using polyalcohol (1) as the polyalcohol or using polyalcohol (2) or using both, both the number of defects and the haze value were improved compared with Inventive Example 2, which contained no polyalcohol.

The type of polyalcohol used will be discussed. Inventive Example 7, which used propylene-based polyalcohol (1), had a smaller number of defects than Inventive Example 8, which used ethylene-based polyalcohol (2). The haze values of Inventive Examples 7 and 8 were substantially equal. Polyalcohol (1) caused a smaller number of defects presumably because polyalcohol (1) had a lower molecular weight, which enabled coating the wafer with higher density.

A comparison between Inventive Examples 2 and 8 shows that polyalcohol (2) significantly reduces the number of defects without causing deterioration in terms of haze value. Further, a comparison between Inventive Examples 2 and 7 shows that using polyalcohol (1) significantly reduces the number of defects, without causing deterioration in terms of haze value, compared with examples using polyalcohol (2). Thus, polyalcohol (1) has a greater ability to reduce the number of defects than polyalcohol (2).

Inventive Examples 7, 21 to 26, Comparative Examples 2 and 6 are inventive and comparative examples for polishing compositions with abrasives, an alkali compound, modified PVA, poloxamine (1) and polyalcohol (1), where the average particle size of abrasives was varied. These inventive and comparative examples reveal that, in polishing compositions containing abrasives, an alkali compound, modified PVA, poloxamine (1) and polyalcohol (1), the number of defects and haze value tend to decrease as the average particle size decreases.

In Inventive Examples 2, 15 and 16, the amount of abrasives (1) was at 3.5%, 5.5% and 7.5%, respectively. Since the number of defects and haze value are at the same level in these three example, it is thought that the amount of abrasives does not significantly affect the polishing performance.

The polishing compositions of Inventive Examples 17 to 20 included abrasives, an alkali compound, modified PVA and polyalcohol, and included no poloxamine. Inventive Examples 17 to 20 significantly reduced the number of defects and haze value.

Inventive Examples 17 and 20, in which the polishing composition included no poloxamine and included polyalcohol, reveal that Inventive Example 20, which used polyalcohol (1) and polyalcohol (2) as the polyalcohol, also provided improvements in terms of the number of defects and haze value.

Inventive Examples 7, 13 and 14 involve polishing compositions including abrasives, an alkali compound, modified PVA, poloxamine and polyalcohol, where the amount of alkali compound was varied. These inventive examples reveal that Inventive Examples 13 and 14, where the amount of the alkali compound was in the range of 0.15 to 0.20 wt %, provided improvements in terms of the number of defects and haze value.

FIG. 1 shows in a graph the results of Inventive Examples 7, 13 and 14, where the amount of the alkali compound is indicated by the horizontal axis and the number of defects and haze value are indicated by the vertical axes. The graph of FIG. 1 demonstrates that the number of defects and haze value are relatively small when the amount of the alkali compound is in the range of 0.1 to 0.2 wt %.

Inventive Example 27 and Comparative Examples 7 and 8 are inventive and comparative examples for polishing compositions containing abrasives, an alkali compound, and modified PVA, where the average particle size of abrasives was varied. These inventive and comparative examples reveal that the number of defects and haze value tend to decrease as the average particle size decreases.

Figure 2:
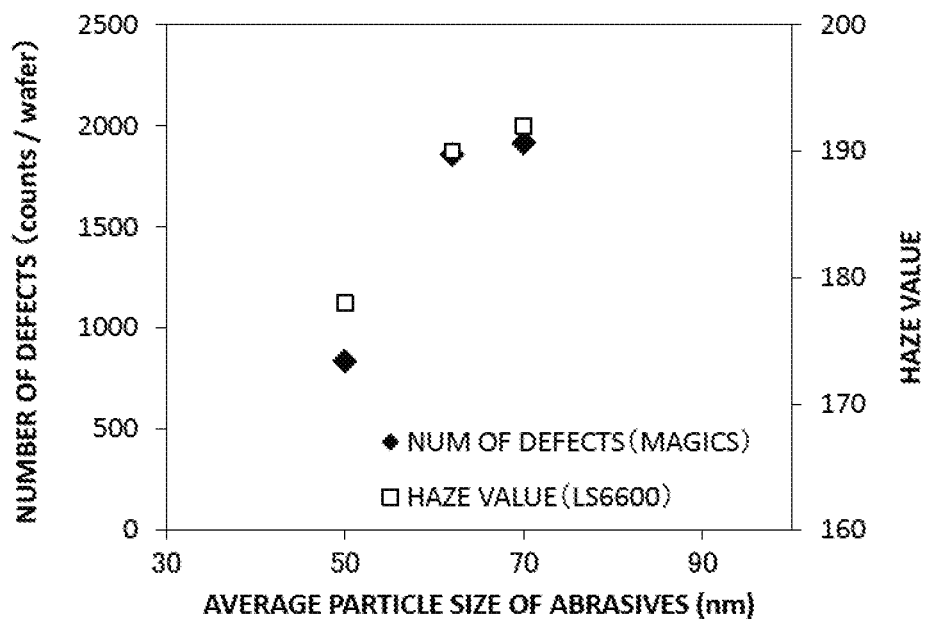
FIG. 2 is a graph showing the relationship between the average particle size of abrasives and the number of defects and haze value for Inventive Example 27 and Comparative Examples 7 and 8.

FIG. 2 shows in a graph the results of Inventive Example 27 and Comparative Examples 7 and 8, where the average particle size of abrasives is indicated by the horizontal axis and the number of defects and haze value are indicated by the vertical axes. The graph of FIG. 2 shows that the number of defects and haze value tend to decrease as the average particle size decreases. Particularly, where the average particle size is not higher than 50 nm, the number of defects and haze value are very small.

When one focuses on the average particle size of particles in a polishing composition, in Inventive Examples 1 to 10, 13 to 20 and 27, which included abrasives (1) of an average particle size of 50 nm, the average particle size of particles in the polishing composition was in the range of 54 to 55 nm. Further, in Inventive Examples 11 and 12, which included abrasives (2) with an average particle size of 30 nm, the average particle size of particles in the polishing composition was in the range of 34 to 35 nm. That is, the average particle size of particles contained in a polishing composition was not more than 1.2 times the average particle size of abrasives alone contained in the polishing composition. Further, in Inventive Examples 21 to 26, the average particle size of particles contained in a polishing composition is not more than 1.2 times the average particle size of abrasives alone contained in the polishing composition, except for Inventive Example 26, which had an original average particle size of 5 nm, which is very small.

If a polishing composition includes hydroxyethyl cellulose (HEC) as the water-soluble polymer, HEC molecules twine around abrasives such that the detected average particle size of particles in the polishing composition is larger than the size of abrasives alone. HEC molecules can easily twine around abrasives presumably because HEC molecules have a steric, three-dimensional structure. In general, it is known that, if a polishing composition includes HEC as the water-soluble polymer, the average particle size of particles contained in the polishing composition is about 1.3 to 1.7 times the average particle size of abrasives alone contained in the polishing composition.

On the other hand, the polishing composition COMP1 of the present embodiment includes modified PVA such that water-soluble polymer cannot easily twine around abrasives. This is presumably because the carbon double bond contained in the modified PVA molecules causes modified PVA molecules to have a generally straight structure. As such, the abrasives that are present in the polishing composition have a size substantially equal to that of abrasives alone. Thus, it is thought that the average particle size of particles contained in the polishing composition is not more than 1.2 times the average particle size of abrasives alone contained in the polishing composition.

Next, to verify the effects of the inclusion of modified PVA, polishing compositions according to Comparative Examples 9 to 12, which included HEC instead of modified PVA, were prepared. The make-up of the polishing compositions of Comparative Examples 9 to 12 is shown in Table 7. In Table 7, the weight percentage for each component indicates the weight percentage relative to the total polishing composition (undiluted solution).

The polishing composition of Comparative Example 9 was made by mixing 5 wt % abrasives, 0.4 wt % ammonium hydroxide ($NH_4OH$), and 0.35 wt % water-soluble polymer (HEC) into water, and providing a total of 100 wt %. The abrasives used here are colloidal silica, and the average particle size measured by dynamic light scattering was 40 nm. The HEC used had a molecular weight of 800,000.

The polishing compositions of Comparative Examples 10 to 12 had the same make-up as Comparative Example 9 except that the abrasives of the polishing composition of Comparative Example 9 were replaced by abrasives with average particle sizes of 60 nm, 70 nm and 73 nm, respectively, as measured by dynamic light scattering. All of these abrasives were colloidal silica, and were present in an amount of 5 wt %.

These polishing compositions were used to perform polishing under the same polishing conditions as those of Inventive Examples 1 to 27 and Comparative Examples 1 to 8 to measure the number of defects and haze value after polishing. However, unlike in Inventive Examples 1 to 27 and Comparative Examples 1 to 8, the number of defects was measured using LS6600. Thus, it should be noted that the number of defects in each of these examples cannot be compared with those in Inventive Examples 1 to 27 and Comparative Examples 1 to 8 in absolute terms.

The average particle size of particles in each of these polishing compositions was measured in the same manner as in Inventive Examples 1 to 27 and Comparative Examples 1 to 8. The results are shown in Table 7.

TABLE 7

|  |  | Comp. Ex. 9 | Comp. Ex. 10 | Comp. Ex. 11 | Comp. Ex. 12 |
|---|---|---|---|---|---|
|  | Average particle size of abrasives [nm] | 40 | 60 | 70 | 73 |
| Composition of undiluted solution [wt %] | abrasives | 5 | 5 | 5 | 5 |
|  | alkali compound ($NH_4OH$) | 0.4 | 0.4 | 0.4 | 0.4 |
|  | water-soluble polymer (HEC) | 0.35 | 0.35 | 0.35 | 0.35 |
|  | non-ionic surfactant (poloxamine (1)) | — | — | — | — |
|  | non-ionic surfactant (poloxamine (2)) | — | — | — | — |
|  | polyalcohol (1) | — | — | — | — |
|  | polyalcohol (2) | — | — | — | — |
|  | Number of defects* | >300000 | 89 | 31 | 45 |
|  | Haze value | overflow | 185 | 167 | 157 |
|  | Average particle size of particles in polishing composition [nm] | 62 | 107 | 122 | 124 |

*measured by LS6600

Figure 3:
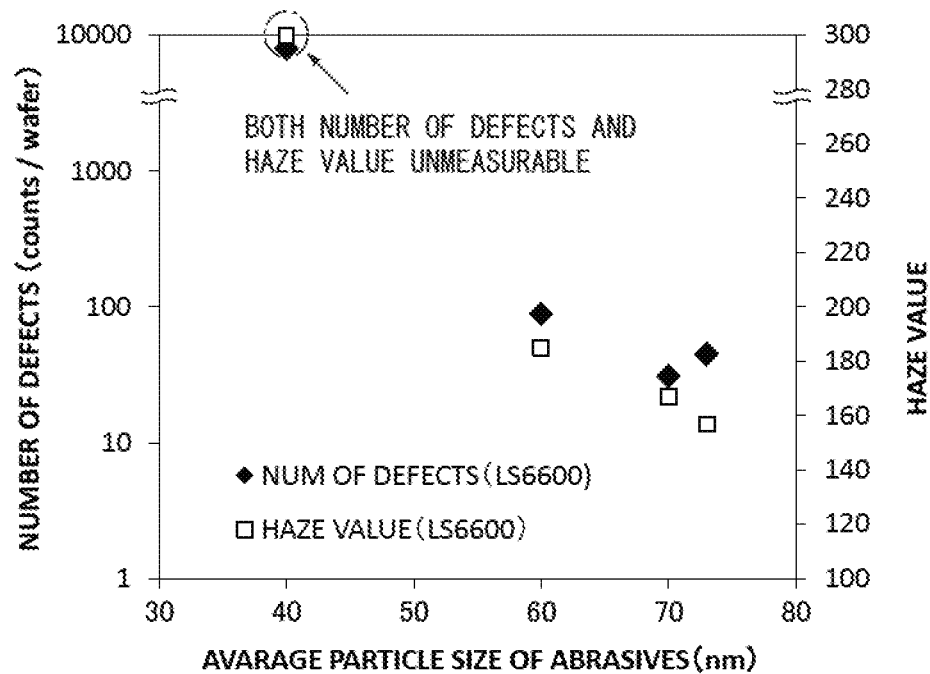
FIG. 3 is a graph showing the relationship between the average particle size of particles and the number of defects and haze value for Comparative Examples 9 to 12.

FIG. 3 shows in a graph the results of Comparative Examples 9 to 12, where the average particle size of abrasives is indicated by the horizontal axis and the number of defects and haze value are indicated by the vertical axes. The graph of FIG. 3 shows that, contrary to that of FIG. 2, the number of defects and haze value tend to increase as the average particle size decreases in a polishing composition including HEC instead of modified PVA. Particularly, for Comparative Example 9, which had an average particle size not more than 40 nm, both the number of defects and haze value were unmeasurable.

Further, the average particle size of particles contained in each of these polishing compositions was in the range of about 1.5 to 1.8 times, i.e. larger than 1.2 times, the average particle size of abrasives alone contained in the polishing composition.

It should be understood that the above-disclosed embodiments are exemplary in every respect and not limitative. It is contemplated that the scope of the present invention is not defined by the embodiments provided above but by the claims, and encompasses all the modifications within the spirit and scope equivalent to those of the claims.

INDUSTRIAL APPLICABILITY

The present invention is useful for polishing compositions.

The invention claimed is:

1. A polishing composition comprising:
abrasives;
at least one water-soluble polymer selected from vinyl alcohol-based resins having a 1,2 diol structural unit expressed by General Formula (1) provided below;
an alkali compound,
where an average particle size of particles in the polishing composition measured by dynamic light scattering is not more than 55 nm,

[Formula 1]

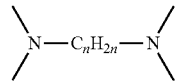 (1)

(in the formula, each of "$R_1$", "$R_2$" and "$R_3$" independently indicates a hydrogen atom or an organic group; "X" indicates a single bond or a joining chain; each of "$R_4$", "$R_5$" and "$R_6$" independently indicates a hydrogen atom or an organic group; and each of "$R_7$" and "$R_8$" independently indicates a hydrogen atom); and a non-ionic surfactant,
wherein the non-ionic surfactant is a diamine compound including an alkylenediamine structure with two nitrogen atoms expressed by General Formula (2) provided below and having at least one block polyether bonded to the two nitrogen atoms of the alkylenediamine structure, where the block polyether is made of an oxyethylene group and an oxypropylene group bonded together,

[Formula 2]

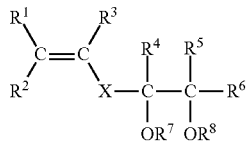 (2)

where n is an integer equal to or larger than 1.

2. The polishing composition according to claim 1, further comprising a polyalcohol.

3. The polishing composition according to claim 2, wherein the polyalcohol is an alkylene oxide derivative of methylglucoside.

* * * * *